(12) United States Patent
Dextraze et al.

(10) Patent No.: US 11,647,611 B2
(45) Date of Patent: May 9, 2023

(54) THERMAL INTERFACE FOR PLURALITY OF DISCRETE ELECTRONIC DEVICES

(71) Applicant: DANA TM4 INC., Boucherville (CA)

(72) Inventors: Jean-Philippe Dextraze, LaPrairie (CA); Jean-Philippe Desbiens, Saint-Bruno de Montarville (CA); Maxime Caron, Montreal (CA); Yannick Philibert, Sainte-Julie (CA)

(73) Assignee: DANA TM4 INC., Boucherville (CA)

( * ) Notice: Subject to any disclaimer, the term of this patent is extended or adjusted under 35 U.S.C. 154(b) by 61 days.

(21) Appl. No.: 16/838,393

(22) Filed: Apr. 2, 2020

(65) Prior Publication Data

US 2020/0321263 A1 Oct. 8, 2020

Related U.S. Application Data (60) Provisional application No. 62/830,030, filed on Apr. 5, 2019.

(51) Int. Cl.
*H01L 23/367* (2006.01)
*H01L 23/40* (2006.01)
(Continued)

(52) U.S. Cl.
CPC ......... *H05K 7/209* (2013.01); *H01L 23/3677* (2013.01); *H01L 23/4093* (2013.01);
(Continued)

(58) Field of Classification Search
CPC ............... H05K 7/2039; H05K 7/2049; H05K 7/20154; H05K 7/20845–20854; H05K 7/2089–209; H05K 7/20945; H05K 1/0201–0204; H05K 1/0209; H05K 2201/10166; H01L 23/367; H01L 23/3677;
(Continued)

(56) References Cited

U.S. PATENT DOCUMENTS

| 4,027,206 A | 5/1977 | Lee |
| 4,342,068 A * | 7/1982 | Kling ................. H01L 23/4006 |
| | | 257/717 |

(Continued)

FOREIGN PATENT DOCUMENTS

ES 2347864 B1 11/2010

*Primary Examiner* — Zachary Pape
*Assistant Examiner* — Amir A Jalali
(74) *Attorney, Agent, or Firm* — McCoy Russell LLP (57) ABSTRACT

A thermal interface for discrete semiconductor devices (such as IGBT's) having a thermally conductive structure, a PCB populated with discrete electronic components, and each of the discrete semiconductor devices having a housing extending beyond the edge of the PCB and in a direction substantially parallel to a plane of the PCB, and a clamp bar secured to the thermally conductive structure adapted to compressively secure each housing to the thermally conductive structure and adapted to maintain thermal contact between a surface of each housing and the surface of the thermally conductive structure. A thermally conductive and electrically insulative pad is positioned between the semiconductor device housing and the thermally conductive structure. A casing enclosing the interface and PCB includes the thermally conductive structure formed on a backwall of the casing.

20 Claims, 9 Drawing Sheets

(51) Int. Cl.
  *H05K 1/02* (2006.01)
  *H05K 7/20* (2006.01)
(52) U.S. Cl.
  CPC .......... *H05K 1/0204* (2013.01); *H05K 1/0209* (2013.01); *H05K 7/2049* (2013.01); *H05K 7/20472* (2013.01); *H05K 7/20509* (2013.01); *H05K 2201/10166* (2013.01)
(58) Field of Classification Search
  CPC ....... H01L 23/40–4006; H01L 23/4093; H01L 23/4081; H01L 23/4087; H01L 23/4037; H01L 23/405; H01L 2023/4075–4087; G06F 1/20; G01R 1/0458
  See application file for complete search history.

(56) References Cited

U.S. PATENT DOCUMENTS

| | | | | |
|---|---|---|---|---|
| 5,450,284 | A * | 9/1995 | Wekell | H01L 23/4006 257/719 |
| 5,592,021 | A * | 1/1997 | Meschter | H01L 23/4006 257/726 |
| 5,731,955 | A * | 3/1998 | Bartanen | H01L 23/4093 248/316.7 |
| 5,812,375 | A * | 9/1998 | Casperson | H05K 1/0204 165/80.3 |
| 6,043,981 | A | 3/2000 | Markow et al. | |
| 6,266,244 | B1 * | 7/2001 | Guthrie | H01L 23/40 165/80.3 |
| 7,715,196 | B2 * | 5/2010 | Chen | H01L 23/4093 361/719 |
| 9,443,786 | B1 * | 9/2016 | Rippel | H01L 25/115 |
| 10,320,105 | B2 | 6/2019 | Fun | |
| 2003/0235038 | A1 * | 12/2003 | Goebl | H01L 25/072 361/719 |
| 2006/0061969 | A1 * | 3/2006 | Nilson | H05K 7/209 361/704 |
| 2008/0158823 | A1 * | 7/2008 | Tominaga | H05K 5/0043 361/709 |
| 2008/0278918 | A1 * | 11/2008 | Tominaga | H05K 7/2049 361/719 |
| 2019/0014681 | A1 * | 1/2019 | Jang | H05K 7/1432 |
| 2020/0053900 | A1 * | 2/2020 | Feurtado | H05K 5/0069 |
| 2021/0092828 | A1 * | 3/2021 | Sasaki | H05K 7/1427 |
| 2021/0210880 | A1 * | 7/2021 | Fu | H01R 12/58 |

* cited by examiner

THERMAL INTERFACE FOR PLURALITY OF DISCRETE ELECTRONIC DEVICES

CROSS-REFERENCE TO RELATED APPLICATIONS

The present application claims priority to U.S. Provisional Application No. 62/830,030, entitled "Thermal Interface For Plurality Of Discrete Electronic Devices," and filed on Apr. 5, 2019, the entire contents of which is hereby incorporated by reference for all purposes.

FIELD

The present disclosure relates to discrete electronic devices, and more particularly to thermal management of heat generated by discrete electronic devices such as switching devices used in automotive vehicle systems.

BACKGROUND AND SUMMARY

Electric vehicles and electric hybrid vehicles make use of power electronics and electrical components that generate substantial amounts of heat during operation. For example, the automotive electric motors used in electric vehicles and electric hybrid vehicles may comprise multiphase AC motors that require an inverter to use DC power supplied by batteries. A rectifier may be required to convert AC power to DC power for charging the batteries. Further, DC-to-DC converters may be required to step-up or step-down DC voltage levels within the power electronic system. Such automotive inverters and DC-to-DC converters typically include discrete switching components that generate considerable heat.

For example, automotive inverters and/or DC-to-DC converters typically comprise arrangements of multiple discrete electronic semi-conductor switching devices, which are heat generating discrete semiconductor solid state switch devices commonly used in automotive power electronics systems. One example of an electronic switching device that is frequently used in power electronics systems an insulated-gate bipolar transistor (IGBT), which is a power semiconductor switching device that is known to combine high efficiency and fast switching. Each IGBT typically comprises an electronic device constructed as a single or discrete unit, such as electronic devices before the advent of integrated circuits (chips) when all transistors, resistors, capacitors and diodes comprised discrete devices. Discrete electronic components are widely used in amplifiers and other electronic products that use large amounts of current and, typically, generate considerable amounts of heat.

Effective and efficient cooling of the electronic semi-conductor devices included in automotive power electronics systems is desirable to ensure efficient system operation, prevent component failure, and minimize or reduce the weight and volume of the power electronics systems. Furthermore, power electronics systems in vehicular applications are subjected to large amounts of heat cycling and physical stress during vehicle operation, and thus thermal management solutions for electronic semi-conductor devices are desirably implemented in a manner that accounts for the combined thermal and physical stresses that such devices are subjected to over their lifetime. Accordingly, there is a need for effective thermal management solutions for discrete electronic semi-conductor devices, including electronic switching devices.

To address at least some of the aforementioned and other problems, embodiments for a thermal interface for a plurality of discrete electronic devices are provided. According to a first aspect of the disclosure is an electronic system comprising a casing having a thermally conductive structure extending from a wall of the structure, a PCB mounted within the casing, a semi-conductor device comprising a semi-conductor circuit encapsulated within a housing and terminal pins for the semi-conductor circuit extending from the housing. The extending terminal pins are secured to the PCB with the housing extending from the PCB. A clamp bar secured to the thermally conductive structure includes a spring clamp element engaging the housing to maintain a surface of the housing in thermal contact with a surface of the thermally conductive structure.

According to another aspect, a thermal interface is disclosed that includes a thermally conductive structure; a PCB secured in position relative to the thermally conductive structure; a plurality of semi-conductor devices each comprising a semi-conductor circuit encapsulated within a housing and terminal pins for the semi-conductor circuit extending from the housing, the extending terminal pins being secured to the PCB; and a clamp bar secured to the thermally conductive structure and including a plurality of spring clamp elements, each spring clamp element engaging the housing of a respective to semi-conductor device to maintain a surface of the housing in thermal contact with the thermally conductive structure.

According to another aspect, a motor vehicle power electronics system is disclosed having a thermal interface for a plurality of discrete electronic semiconductor devices, the system having: a casing adapted to enclose the plurality of devices in an enclosed space, the casing having a thermally conductive structure extending inward into the enclosed space from a wall of the casing; a PCB mounted within the enclosed space and populated with discrete electronic components; each of the plurality of discrete electronic semi-conductor devices having a housing and terminal pins extending from the housing, and each housing extending in a direction substantially parallel to a plane comprising the PCB beyond an edge of the PCB; and a clamp bar secured to the thermally conductive structure and having a plurality of spring clamp elements, each spring clamp element compressibly securing a respective one of the plurality of devices to maintain thermal contact between a surface of the device housing and a thermally conductive and electrically insulative pad positioned upon the thermally conductive structure.

It should be understood that the summary above is provided to introduce in simplified form a selection of concepts that are further described in the detailed description. It is not meant to identify key or essential features of the claimed subject matter, the scope of which is defined uniquely by the claims that follow the detailed description. Furthermore, the claimed subject matter is not limited to implementations that solve any disadvantages noted above or in any part of this disclosure.

BRIEF DESCRIPTION OF THE DRAWINGS

The accompanying drawings are incorporated herein as part of the specification. The drawings described herein illustrate embodiments of the presently disclosed subject matter, and are illustrative of selected principles and teachings of the present disclosure. However, the drawings do not illustrate all possible implementations of the presently dis

Figure 7:
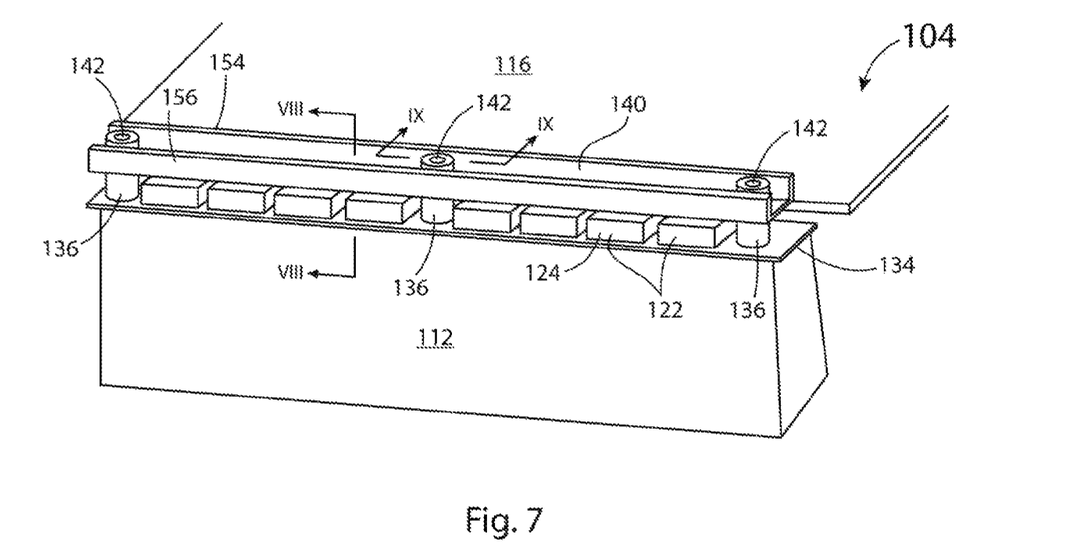
FIG. 7 is a schematic partial perspective view of the electronic module of FIG. 2 within a casing of the power electronic system of FIG. 1.
Figure 8:
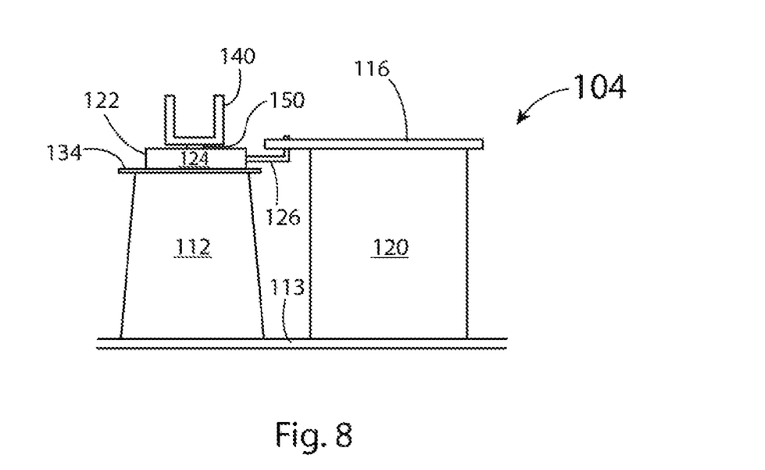
FIG. 8 is a schematic partial end view of the electronic module of FIG. 2 within a casing of the power electronic system of FIG. 1.
Figure 9:
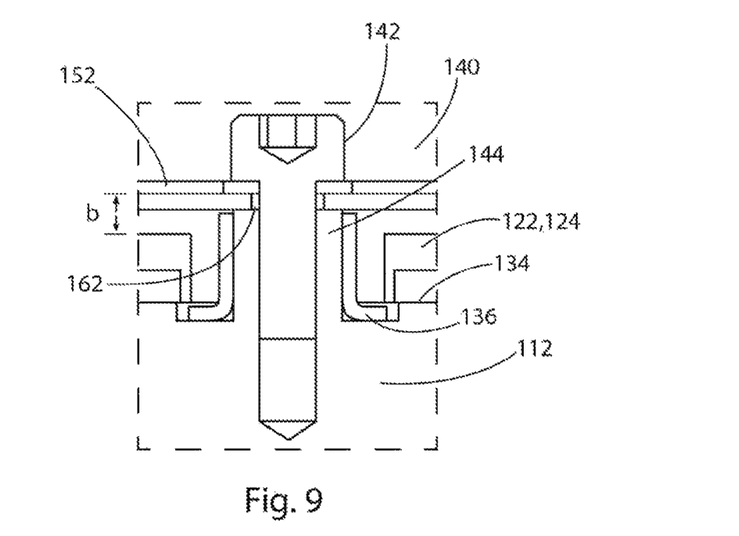
FIG. 9 is a partial sectional view taken along line IX-IX of FIG. 7.

Similar reference numerals may have been used in different figures to denote similar components. FIGS. 1-4 are shown approximately to scale, according to some embodiments. FIGS. 7-9 are shown with components in proportional size with one another, according to some embodiments.

DETAILED DESCRIPTION

It is to be understood that the invention may assume various alternative orientations and step sequences, except where expressly specified to the contrary. It is also to be understood that the specific assemblies and systems illustrated in the attached drawings, and described in the following specification are simply exemplary embodiments of the inventive concepts defined herein. Hence, specific dimensions, directions or other physical characteristics relating to the embodiments disclosed are not to be considered as limiting, unless expressly stated otherwise. Also, although they may not be, like elements in various embodiments described herein may be commonly referred to with like reference numerals within this section of the application.

Figure 1:
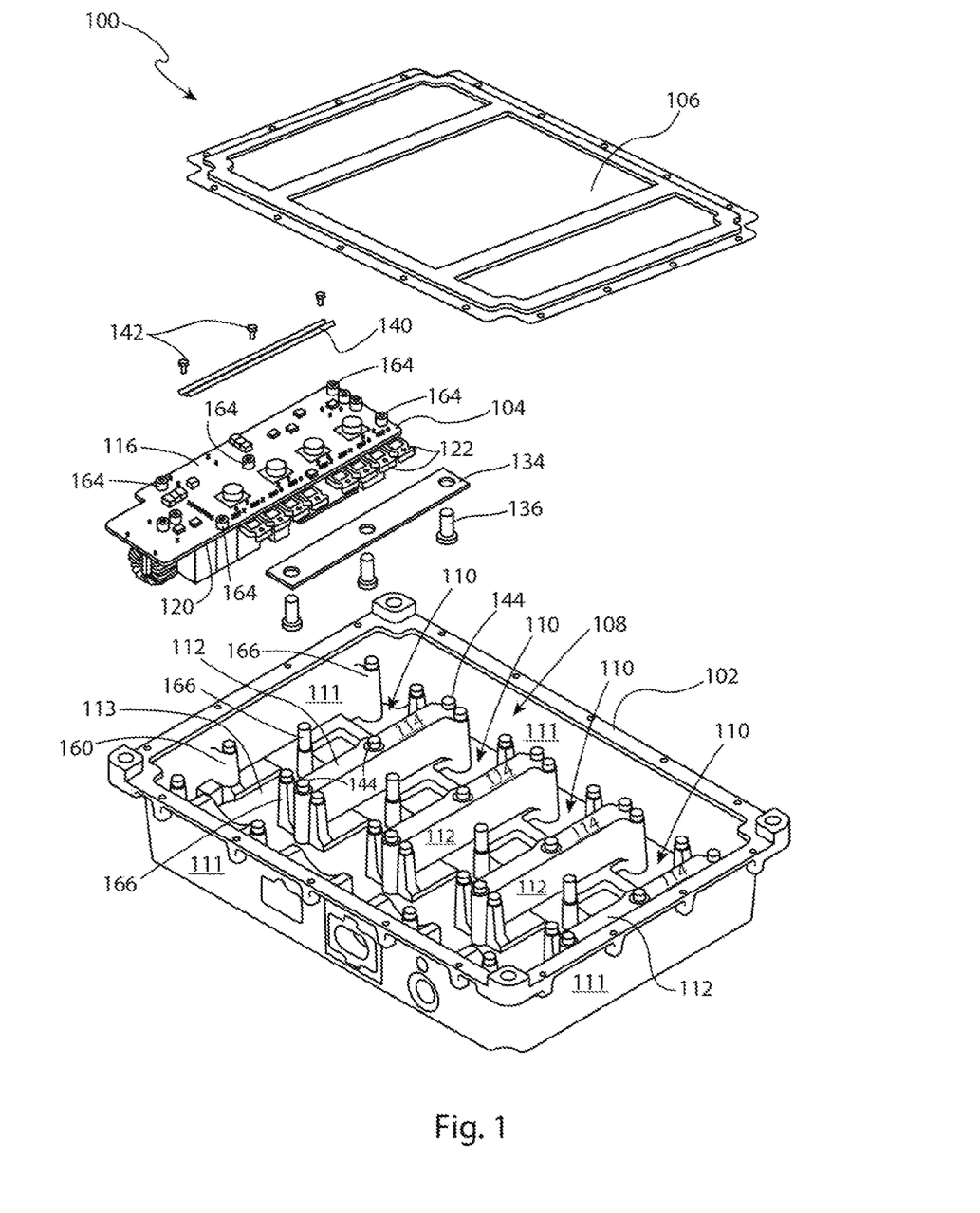
- FIG. 1 is a partial exploded perspective view of a power electronic system according to example embodiments.
Figure 5:
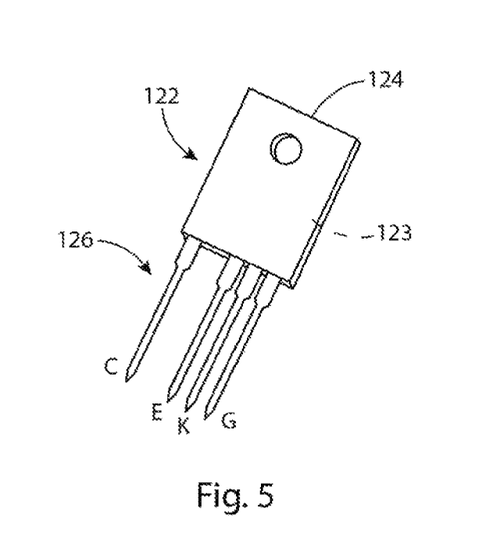
FIG. 5 is a perspective view of a semi-conductor power device of the electronic module of FIG. 2.
Figure 6:
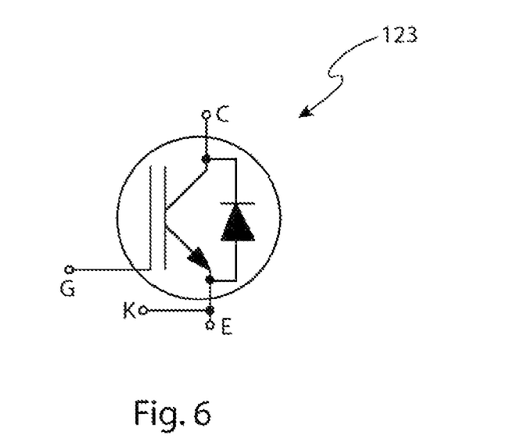
FIG. 6 is a schematic view of a semi-conductor circuit of the device of FIG. 5.
Figure 10:
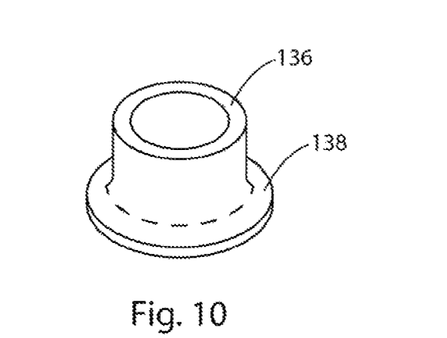
FIG. 10 is a perspective view of an insulating ferrule used in the power electronic system of FIG. 1.
Figure 11:
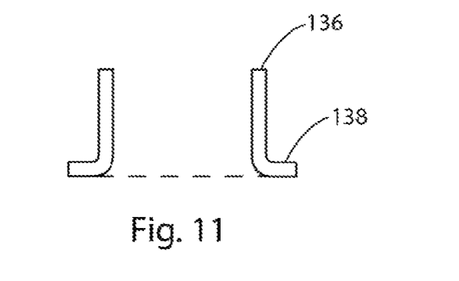
FIG. 11 is a sectional view of the insulating ferrule of FIG. 10.
Figure 12:
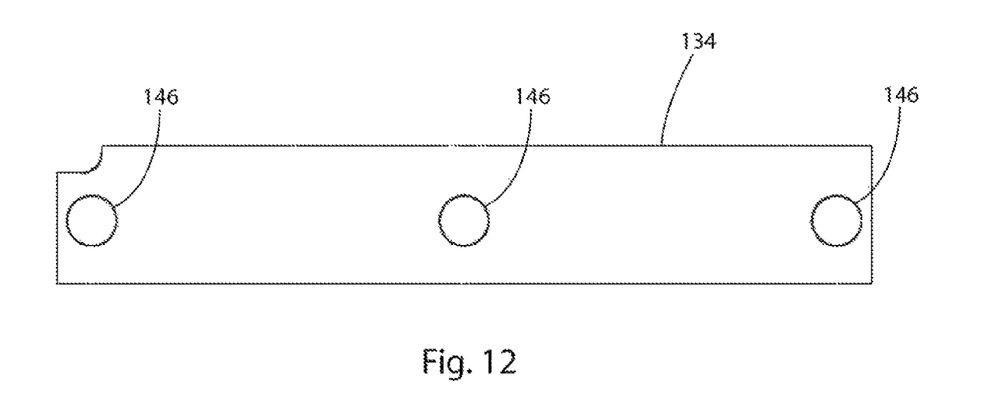
FIG. 12 is a plan view of a thermal pad used in the power electronic system of FIG. 1.

As an overview, FIG. 1 illustrates an exploded view of an exemplary motor vehicle power electronics system having a casing and a cover for enclosing a thermal interface for a plurality of discrete electronic semiconductor devices. FIGS. 2-5 illustrate various exemplary orientations and views of a PCB and discrete electrical components attached thereto. FIG. 6 illustrates a schematic for an exemplary switching component. FIGS. 7 and 8 illustrate an exemplary thermal interface comprising housings of multiple discrete semiconductor devices held between a clamp bar and thermal conductive structure, the thermal interface assembly extending away from a planar edge of the PCB. FIGS. 9-11 illustrate exemplary detail views of a clamp bar preferably thermally conductively and electrically insulatively secured to thermal conductive structure. And FIGS. 12-17 illustrate exemplary detail views of a clamp bar, the clamp bar having spring clamp elements formed therein.

The present inventors determined improvements were needed to automotive vehicle systems, such as battery charging systems with inverters and/or DC-to-DC converters, having switching components that generate considerable heat. Configurations for insulated gate bipolar transistors (IGBT's) (heat generating solid state switch elements) that include connection of the IGBT's at a 90 degree angle to a PCB or soldering the terminal pins of each IGBT to a copper busbar may be less compact and less cost effective than desirable, especially when multiple switching components are used. The present inventors discovered and invented the embodiments described herein, which include orienting a plurality switching components, such as IGBT's, to extend outward in a parallel orientation from an edge of the PCB, and compressing each of the switch housings, evenly from switch to switch, between a U-shaped/U-channel thermally conductive bar and thermally conductive structure formed to extend inward from a casing wall (the casing enclosing the power electronics and electrical components of the system), with a thermal pad between the switch housings and the casing. The compression bar preferably includes integrally formed clamp features for maintaining contact between the switch housing and the thermal pad. In this way, the present inventors discovered, the heat generated may be dissipated spatially farther away from other electrical components within the system, thus improving thermal management of the system overall; the power electronics system may comprise a more compact unit, having a lower height than a system comprising the switching components oriented other than outward from and generally parallel with an edge of the PCB; and the system comprises thermally conductive structure extending from the casing material rather than requiring additional air movement fans, heat dissipating fin structures, soldering to copper busbars, and/or other methods, thus reducing complexity and costs.

FIG. 1 is an exploded perspective view of selected components of a power electronic system 100, showing one possible implementation of a thermal management system in accordance with example embodiments of the present disclosure. As will be apparent from the following description, the thermal management system described herein can be applied in different configurations and used in different types of power electronic circuits and power electronics systems in addition to specific power electronic system shown in FIG. 1.

In the illustrative example of FIG. 1, the power electronic system 100 includes, among other things: a casing 102, a plurality of electronic modules 104 (only one module 104 is shown in FIG. 1) that are received within a chamber 108 of the casing 102, and a front cover 106 that can be secured to the casing 102 to protect the contents of chamber 108 from external elements. In the illustrated example, the power electronics system 100 is an isolated bidirectional DCDC converter system, and the power electronics modules 104 are each isolated bidirectional DCDC converter modules. In this regard, in the illustrated example, each electronic module 104 is configured to operate in a first DCDC directional mode to convert a DC voltage received from a rectifier/inverter circuit at a first current/voltage level to a second current/voltage level to charge a battery and to operate in a second DCDC directional mode to perform the reverse operation to supply the rectifier/inverter circuit with DC current that can be converted to AC current for a motor.

In example embodiments the casing 102 includes four sidewalls 111 and a backwall 113 that define internal chamber 108, and the casing 102 is formed from a rigid thermally conductive material, for example metal. In the illustrated example, the casing chamber 108 includes a plurality (e.g. four in the illustrated example) of sub-chamber regions 110, each of which is configured to receive a respective electronic module 104. Each of the sub-chamber regions 110 is bounded along one side by a respective thermally conductive support structure 112 that extends from the back wall 113 of the casing 102. In the example of FIG. 1, each support structure 112 is formed as part of, and thus thermally integrated with, the casing 102 and is a generally rectangular structure that defines a planar support surface 114. In example embodiments the casing 102 includes multiple PCB mounting structures 166 that extend forward into sub-chamber regions 110 from the casing back wall 113. The mounting structures 166 each have a forward end for defining a threaded opening for a respective machine screw.

In the illustrated example, the casing 102 is formed from a single unitary piece of aluminum or aluminum alloy that has been machined to create the casing structure shown in FIG. 1. In alternative example embodiments, casing 102 may be cast or molded as a unitary structure. In some alternative examples, casing 102 may be formed from multiple discrete components that are welded or otherwise secured together, and in some examples at least some of the casing components may be extruded components.

Figure 2:
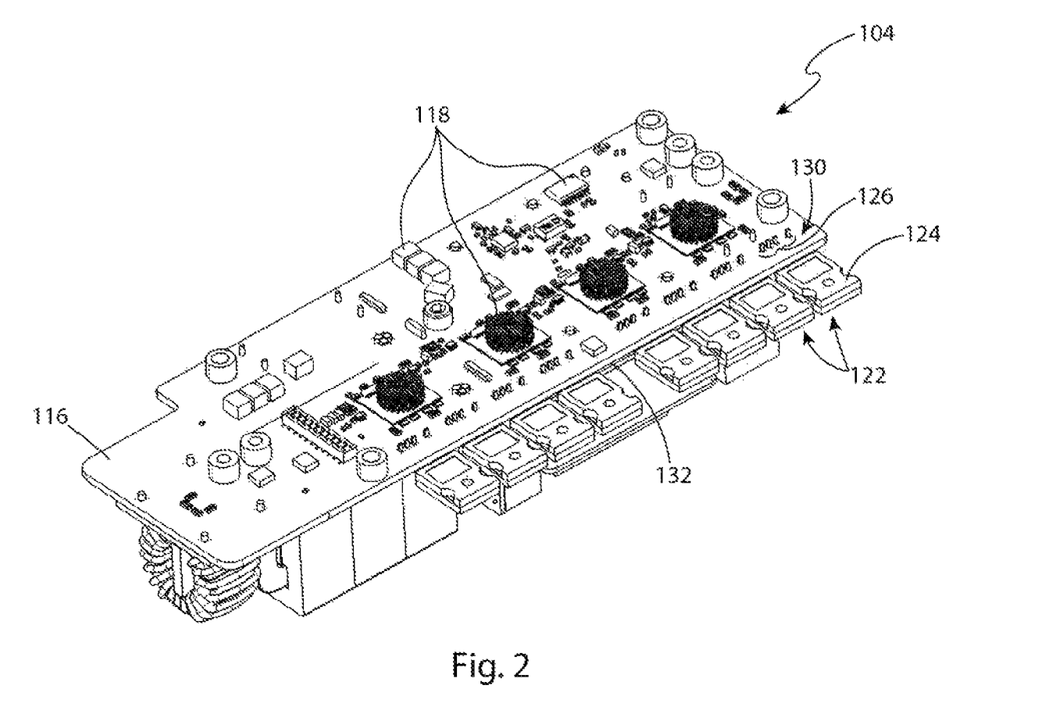
FIG. 2 is a top perspective view of an electronic module of the system of FIG. 1.
Figure 3:
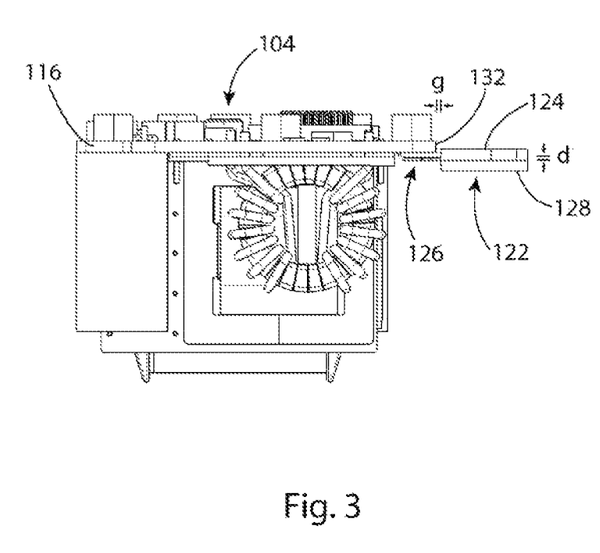
FIG. 3 is an end view of the electronic module of FIG. 2.
Figure 4:
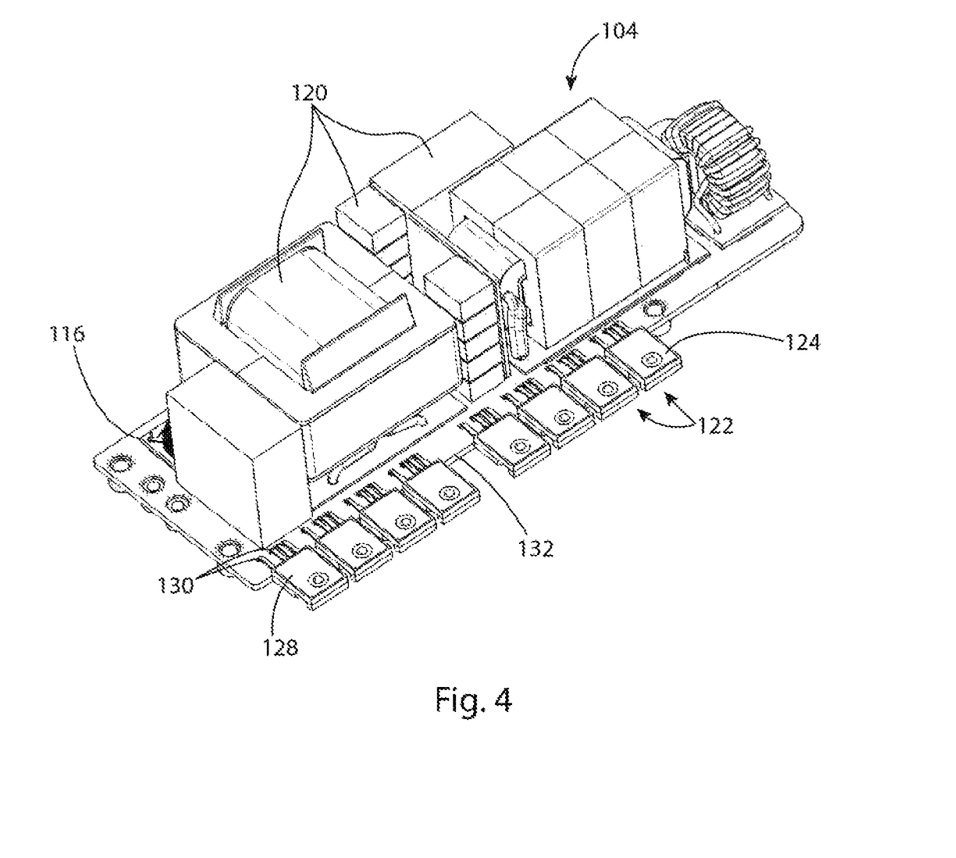
FIG. 4 is a bottom perspective view of the electronic module of FIG. 4.

FIGS. 2 to 4 illustrate an example of electronic module 104 in greater detail. Electronic module 104 includes a printed circuit board (PCB) 116 that includes plurality of smaller electronic components 118 mounted to one side (for example a front PCB side, as shown in FIG. 2) and a plurality of larger discrete electronic components 120 secured to the PCB 116 on its opposite side (for example a back PCB side, which is illustrated in FIG. 4). In an example embodiment the electronic components 118 on the PCB front side are supported by the PCB 116 and may for example include control circuit components such as resistors, capacitors, transformers, and other active and passive components. The electronic components 120 on the PCB backside may include, among other things, larger volume, high voltage, high-heat generating power circuit components such as capacitor modules, resistor modules, and transformer modules. In example embodiments, staggered support surfaces are provided on the back wall 113 of casing 102 for engaging at least some of the electronic components 120 on the lower PCB side of PCB 116 for the dual purpose of supporting the electronic components 120 and providing a heat sink for such components. The configuration, type and operation of electronic components 118, 120 can take many different forms in various embodiments and are not the focus of the present disclosure, unless otherwise indicated.

Of particular interest in the present disclosure, the electronic module 104 includes a row of discrete power semiconductor devices, for example electronic switching devices 122, secured along an edge of the PCB 116. The electronic switching devices 122 are discrete in that they are each independent physical units that are each physically mounted to PCB 116 independently of each other. As indicated in FIGS. 5 and 6, each electronic switching device 122 includes a respective semi-conductor switch circuit 123 that is encapsulated within a non-conductive rectangular housing 124. A set of conductive pins 126 extend from terminals of switch circuit 123 and outward from an end of the housing 124. In the illustrated example the electronic switch circuit 123 includes an insulated-gate bipolar transistor (IGBT) with an antiparallel diode. The IGBT includes collector, emitter, Kelvin emitter, and gate terminals that are each electrically connected to a respective pin 126, namely collector pin C, emitter pin E, Kelvin emitter pin K, and gate pin G. In example embodiments, a backside surface of the housing 124 is covered with a conductive pad 128 that is electrically coupled with collector pin C to the IGBT collector of switch circuit 123. In a non-limiting example embodiment, each discrete electronic switching device 122 consists of an INFINEON™ high speed IGBT part number 1KZ50N65EH5 650V DuoPack IGBT and diode. In an example embodiment, pins 126 each extend a length of approximately 20 mm (0.787 inches) from the housing 124, and the housing 124 has frontside and backside surface dimensions of approximately 21 mm (0.83 inches) by 16 mm (0.63 inches) and a thickness of approximately 5 mm (0.2 inches).

As shown in FIGS. 2 to 4, in the illustrated embodiment, sets of plated-through-holes (PTHs) 130 are provided in a row through PCB 116 for receiving and securing the pins 126 of the discrete electronic switching devices 122. Prior to or during PCB assembly, the pins 126 of each electronic switching device 122 are bent at an intermediate location to include a 90-degree bend, and the bent terminal ends of the pins 126 are received through and soldered within respective PTHs 130 to secure the electronic switching devices 122 to PCB 116. As illustrated in FIGS. 2 to 4, the PTHs 130 are located in a row that is sufficiently close to a side edge 132 of the PCB 116 to enable the housing 124 of each switching device 122 to extend laterally outward from the side edge 132. In the illustrated example, as best seen in FIG. 3, a gap "g" exists between the housing 124 of each switching device 122 and the PCB edge 132. In the illustrated embodiment, the switching devices 122 extend from the PCB edge 132 in physical alignment with each other with their respective housings 124 located in a plane that is approximately parallel to the PCB plane. In some example embodiments the gap "g" at the closest point between housing 124 and the PCB edge 132 is within a range of approximately 0.5 mm and 3 mm (0.02 inches to 0.12 inches). In the illustrated embodiment, the pins 126 of each switching device 122 are inserted into PTHs 130 from back surface of the PCB 116, with the result that each electronic switching device 122 backside surface is approximately parallel to and offset backwards a distance "d" from the back surface of the PCB 116. In example embodiments, the surface offset distance "d" is within a range of approximately 1 mm and 4 mm (0.04 inches to 0.16 inches). In the illustrated example, as best seen in the side views of FIGS. 3 and 8, the top or front side of PCB 116 is offset from the corresponding top surface of each housing 124.

The installation of electronic module 104 within casing 102 will now be described with reference to the exploded view of FIG. 1, partial view of FIG. 7, and sectional view of FIG. 8. During assembly of the power electronic system 100, electronic module 104 is placed within its respective sub-chamber region 110 with at least some of the module's backside electronic components 120 resting on respective thermal support surfaces defined by the casing back wall 113. The PCB 116 sits on, and is secured with one or more fasteners such as machine screws 164, to the forward ends of PCB mounting structures 166 located in sub-chamber region with one or more fasteners such as machine screws 164.

As shown in the figures, the row of electronic switching devices 122 of the electronic module 104 are arranged with their respective housings 124 located along the planar support surface 114 of the thermally conductive support structure 112 that extends along-side and adjacent to the PCB 116. In particular, the back surface of each of the electronic switching devices 122 is in thermal contact with the planar support surface 114.

As shown in FIGS. 1, 7 and 8, in the illustrated embodiment, an elongate clamping bar 140 is used to compressively secure the row of electronic switching devices 122 to the thermally conductive support structure 112. In the illustrated embodiment, the clamping bar 140 is secured to the thermally conductive support structure 112 using fasteners such as hex-head machine screws 142. In this regard, as shown in FIG. 1, in example embodiments, thermally conductive support structure 112 is formed with a corresponding plurality of cylindrical projections 144 that extend forward beyond support surface 114. The projections 144 each define a respective opening that is threaded within the conductive support structure 112 for receiving the end of a respective one of the machine screws 142.

FIG. 9 is a sectional view illustrating a machine screw 142 extending through the opening defined by one of the projections 144. As shown in FIGS. 1, 7 and 9, in example embodiments an electrically insulating cylindrical ring or ferrule 136 is mounted on each of the projections 144 during assembly prior to installation of module 104. The insulating ferrules 136 are provided to electrically insulate any exposed conductive elements of the electronic switching devices 122 from inadvertent electrical contact or electrical arcing with projections 144. FIGS. 10 and 11 show further perspective and sectional views of an insulating ferrule 136 according to example embodiments. As seen in the figures, insulating ferrule 136 may include a radial flange 138 at its back end for contacting the thermally conductive support structure 112 about a circumference of the projection 144 at the location where the projection 144 extends from the rest of the thermally conductive support structure 112. In some examples, a circumferential recess maybe formed in the support surface 114 about each projection 144 for accommodating the flange 138. Although described above as being cylindrical, projections 144 and their respective insulating ferrules 136 could have other shapes, such as polygonal or oval, for example. Although three projections 144 and three corresponding machine screws 142 are shown in the figures for securing clamping bar 140, fewer or more may be used in other embodiments.

In example embodiments, an electrically insulating, thermally conductive interface, for example a thermal pad 134, is located between the row of electronic switching devices 122 and forward facing support surface 114 of the thermally conductive support structure 112. Referring to FIGS. 1, 7, 8 and 12, in example embodiments, thermal pad 134 is configured to cover the support surface 114 of thermally conductive support structure 112, and defines respective pass-through openings 146 for the ferrule-surrounded protrusions 144. In one non-limiting example, thermal pad 134 has approximate rectangular surface dimensions of 188 mm (7.40 inches) by 32 mm (1.26 inches). In an example embodiment the thermal pad 134 is implemented using an electrically insulating SIL-PAD™ material available from Bergquist. As noted above in some examples, electronic switching devices 122 may have an exposed backside collector terminal pad on a back surface of the housing, and in at least some example embodiments the thermal pad 134 functions to electrically insulate the backside collector terminal pad from the thermally conductive support structure 112 while at the same time provide a uniform thermally conductive interface between the housing 124 of each discrete electronic switching device 122 and the surface 114 of the thermally conductive support structure 112.

Figure 13:
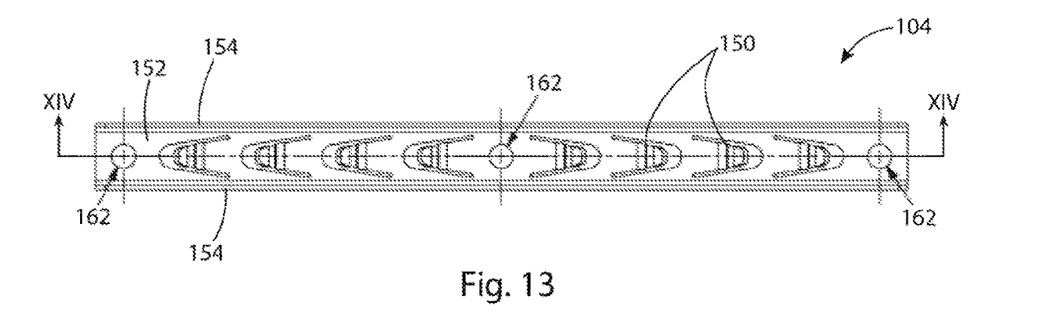
FIG. 13 is a plan view of a clamp bar used in the power electronic system of FIG. 1.
Figure 14:
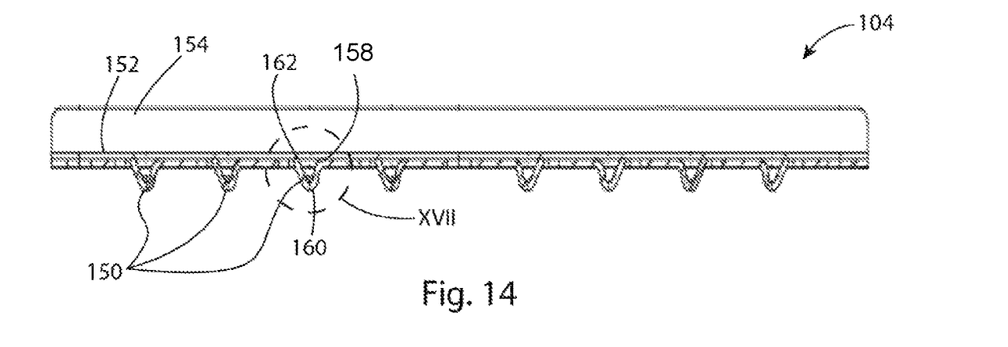
FIG. 14 is a sectional view of the clamp bar taken along line XIV-XIV of FIG. 13.
Figure 15:
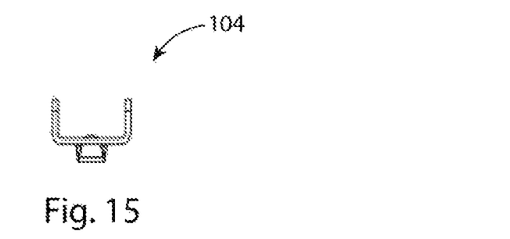
FIG. 15 is an end view of the clamp bar of FIG. 13.
Figure 16:
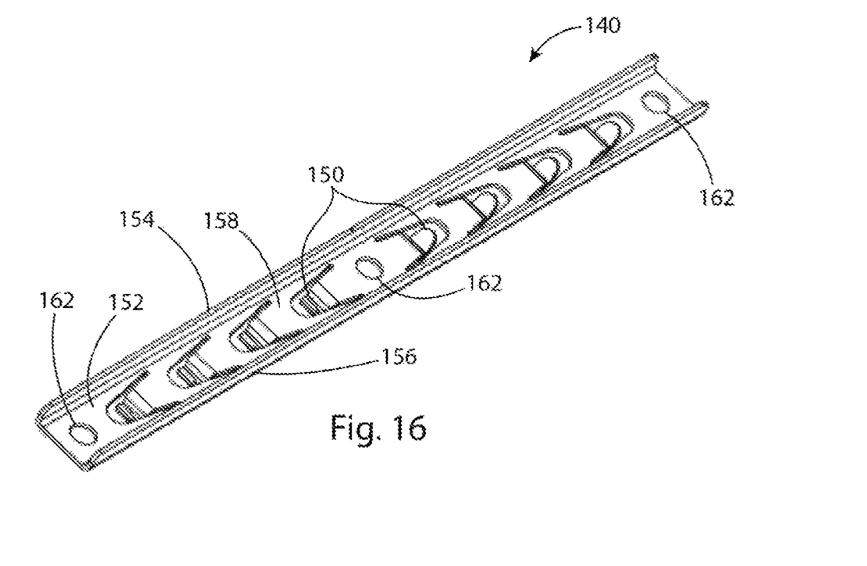
FIG. 16 is a perspective view of the clamp bar of FIG. 13.

FIGS. 13 to 15 illustrate an example embodiment of clamping bar 140. As noted above, clamping bar 140 is used to compressively secure the row of discrete electronic switching devices 122, and in particular the housings 124 of such devices, to the support surface 114 of thermally conductive support structure 112. The dimensions of each switching device housing 124 may vary between the electronic switching devices 122 due to manufacturing tolerances, and additionally, during operation, thermal expansion and contraction of the housings 124 may occur. Furthermore, relative movement of the PCB 116 and thermally conductive support structure 112 may occur during operation due to one or both of vibration and thermal expansion/contraction. Accordingly, in example embodiments the clamping bar 140 is configured to apply a discrete, flexible compressive force to each of the switching device housings 124 individually to accommodate such factors.

Figure 17:
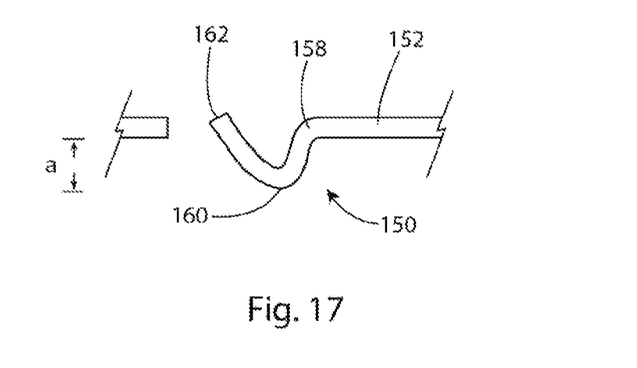
FIG. 17 is an enlarged view of the portion of FIG. 14 indicated by circle XVII.

In this regard, as shown in FIGS. 13 to 16, the clamping bar 140 includes a plurality of protruding resilient clamp elements 150, each configured to compressively engage a respective switching device housing 124 to retain the switching device housing 124 in place against support surface 114 of the thermally conductive support structure 112. In example embodiments, the clamping bar 140 is an elongate metal U-bar having an elongate central base-wall member 152 that is bounded on opposite sides by elongate opposing side-walls 154, 156. In example embodiments, resilient clamp elements 150 are formed by cutting Ushaped tabs from the central base-wall member 152, and bending each resulting tab to form a leaf spring structure. FIG. 17 illustrates a side sectional view of a resilient spring clamp element 150 in greater detail. Referring to FIGS. 13 to 16, resilient spring clamp element 150 includes a fixed first end 158 that is attached to the base-wall 152, and a free end 162. Resilient spring clamp element 150 includes an intermediate hook-shaped bend between its first fixed end 158 and its free end 162 to provide a contact portion 160 that protrudes a distance "a" below a bottom surface of the base-wall 152. In an illustrative example embodiment, the distance is approximately 3.1 mm (0.122 inches).

In some examples, a stamping operation may be used to cut and form resilient clamp elements 150 in the base-wall 152. In some examples, the clamping bar 140 may be formed from a planar, rectangular metal blank that is stamped using one or more stamping operations to form the sidewalls 154, 156, clamp elements 150, and fastening holes 162. In the illustrated embodiment, eight resilient clamp elements 150 are formed along the length of the base-wall 152 for respectively securing eight discrete electronic switching device housings 124 to the support surface 114 of thermally conductive support structure 112. In the illustrated embodiment, three fastening holes 162 are defined through the basewall 152 to align with respective cylindrical projections 144 of thermally conductive support structure 112 and receive respective machine screws 142 to secure the clamping bar 140 in place on thermally conductive support structure 112. When the clamping bar 140 is secured in place, the contact portion 160 of each resilient spring clamp element 150 compressively engages a respective electronic switching device housing 124 against thermal pad 134 and support surface 114. In the illustrated embodiment, two of the fastening holes 162 are located near opposite ends of the clamping bar 140 and one fastening hole 162 is centrally located on the clamping bar 140, with an equal number of resilient clamp elements 150 located on either side of the central fastening hole 162. In some examples, the resilient clamp elements 150 located on one side of the central fastening hole 162 may be oriented in an opposite direction than the resilient clamp elements 150 located on the other side of the central fastening hole 162.

As best seen in FIG. 9, in example embodiments, the fastening holes 162 defined by the base-wall 152 of clamping bar 140 each have a smaller diameter than the cylindrical projections 144 that extend from the thermally conductive support structure 112, enabling the base-wall 152 of clamping bar 140 to rest on and be secured against the projecting ends of the cylindrical projections 144, thereby providing a gap "b" between the opposing surfaces of the clamping bar base-wall 152 and each of the electronic switching device housings 124. The gap "b" is less than the distance "a" that the contact portion 160 of each spring clamp element 150 protrudes from the bottom surface of the base-wall 152. In an illustrative example embodiment, the gap "b" is approximately 2 mm (0.08 inches).

In some examples, clamping bar 140 may be formed from stainless steel, aluminum, aluminum alloy, or other metal alloy. In some examples, clamping bar 140 may be formed from plastic material.

The use of a thermally conductive support structure 112 that is not secured directly to PCB 116 and is thermally integrated with the back wall 113 of casing 102 may in at least some example embodiments provide efficient removal of heat from electronic switching devices 122. The use of a clamping bar 140 that incorporates a row of independently compressible spring clamping elements 150 allows a different resilient clamping force to be simultaneously applied to each of the electronic switching devices 122, allowing for differences between electronic switching devices 122 and also reducing stresses that might otherwise be applied to the weld connections between pins 126 and the PCB 116 due to thermal cycling and vibrational forces.

In some alternative examples, switching device pins 126 are bent in the opposite direction and the PCB 116 be configured so that the pins 126 of each switching device 122 are inserted through PTHs 130 from the front surface of the PCB 116, in which case each switching device 122 backside surface would be approximately parallel to and offset forwards from the front surface of the PCB 116. In some examples, the support surface 114 and switching devices 122 could be arranged at an angle that is not parallel to the plane of PCB 116.

Referring back to FIGS. 7 and 8, the edge of the electronic module 104 is shown having, extending outward and away from the edge of the PCB 116, the housings of multiple switch circuit elements 122 compressed between spring clamp components 150 of a U-shaped clamp bar 140 and thermal conductive pad material 134 and thermal conductive structure 112 of casing 102. As shown in FIG. 7, a plurality of electronic switching devices 122 are positioned in a row, and clamped by the U-channel clamp bar 140 so as to maintain thermal contact with the thermal pad 134 and thermally conductive structure 112 thereunder. Each of the fasteners 142 and ferrules 136 preferably secure the clamp bar 140 to the thermally conductive structure 112. As shown in FIG. 8, a clamp bar assembly comprising the clamp bar 140, the semiconductor housings 124, the thermal pad 134, and the thermally conductive structure 112 has a clamp bar assembly height extending into the space enclosed by casing 102 and cover 106, and is positioned outward and away from the edge of the PCB 116. As shown, the aforementioned clamp bar assembly comprising the clamp bar 140 is in a side-by-side orientation with a PCB assembly comprising the PCB 116 and the discrete electrical components 120 attached to the underside of PCB 116, with pins 126 of the switching devices 122 interconnecting the clamp bar 140 assembly and the PCB 116 assembly. The side-by-side arrangement allows for portions of the casing back wall (or back wall material, or base, or base material) 113 between each pair of clamp bar and PCB assemblies. Such side-by-side arrangement allows for spatial separation of the discrete electrical components of the electrical system 100. Such side-by-side arrangement further provides for the height of casing side walls 111 to be determined based on one or the other of the clamp bar or PCB assemblies, and shorter in height (in a direction away from casing base/back wall 113, and inward toward the space enclosed within casing 102 and cover 106) than if the height were to be determined based upon a combination of one (clamp bar or PCB) assembly and at least part of the other (PCB or clamp bar) assembly.

Also as illustrated in FIG. 8, the thermally conductive structure 112 preferably comprises material extending from the casing back wall (or base) 113 inward into the space enclosed by the casing 102 and cover 106 in a direction substantially perpendicular to the PCB 116 and housings 124, the PCB 116 and housings 124 being substantially parallel with one another, such that the thermally conductive structure 112 forming the lower portion of each clamp bar assembly extends inward from the casing back wall 113 to a height of the thermally conductive structure that is large enough to bring a top surface of the housings 124 to be above (in the direction away from the casing back wall 113) at least a lower surface of the PCB 116, the lower surface of the PCB 116 having the discrete electronic components 120 attached thereon.

In some embodiments, the thermally conductive structure 112 forming the lower portion of each clamp bar assembly extends inward from the casing base/back wall 113 to a height of the thermally conductive structure that is large enough to that a distance between the clamp bar 140 and the base/back wall 113 is the same or greater than a height of the largest of the discrete electric components 120 attached to the lower surface of the PCB 116, or the same or greater than a distance between the base and the lower surface of the PCB 116. Thus, the thermally conductive structure 112, as illustrated in FIG. 8, preferably extends away from the back wall 113 enough to accommodate the discrete components attached to the lower surface of the PCB 116.

In one embodiment, a thermal interface for a plurality of discrete electronic semiconductor devices includes a thermally conductive structure extending from a base, a PCB mounted in a position relative to the thermal conductive structure and populated with discrete electronic components, each of the plurality of discrete electronic semiconductor devices having a housing and terminal pins extending from the housing, and each housing extending in a direction substantially parallel to a plane comprising the PCB beyond an edge of the PCB, and a clamp bar secured to the thermally conductive structure and adapted to compressively secure each housing between the clamp bar and a surface of the thermally conductive structure and to maintain thermal contact between a surface of each housing and the surface of the thermally conductive structure.

In one aspect, the interface further comprises a thermally conductive and electrically insulative pad positioned upon the surface of the thermally conductive structure between the surface of each housing and the thermally conductive structure.

In one aspect, the clamp bar comprises a plurality of spring clamp elements, each spring clamp element compressively securing a respective one of the plurality of devices to maintain thermal contact between a surface of the device housing and the thermally conductive structure.

In one aspect, the plurality of spring clamp elements are formed on a base wall of the clamp bar.

In one aspect, the clamp bar comprises a U-shaped bar, the base wall being bounded along opposite side edges by side walls.

In one aspect, each of the plurality of discrete electronic semiconductor devices comprises a switching circuit.

In one aspect, each of the plurality of discrete electronic semiconductor devices comprises an insulated-gate bipolar transistor (IGBT).

In one aspect, the thermally conductive structure is integrally formed with the base, the PCB being mounted to the base.

In one aspect, the clamp bar includes a plurality of spring clamp elements, each spring clamp element compressively securing a respective one of the plurality of devices to maintain thermal contact between a surface of the device housing and a thermally conductive and electrically insulative pad positioned upon the surface of the thermally conductive structure.

In one aspect, the thermally conductive structure extends from the base in a direction substantially perpendicular to the plane of the PCB and substantially perpendicular to the surface of each housing, the surface of each housing being substantially parallel with one another, such that the thermally conductive structure extends from the base to accommodate a required distance between the base and a lower surface of the PCB, the lower surface of the PCB having the discrete electronic components attached thereon.

In another embodiment, a motor vehicle power electronics system having a thermal interface for a plurality of discrete electronic semiconductor devices, the system comprises: a casing adapted to enclose the plurality of devices in an enclosed space, the casing having a thermally conductive structure extending inward into the enclosed space from a wall of the casing; a PCB mounted within the enclosed space and populated with discrete electronic components; each of the plurality of discrete electronic semiconductor devices having a housing and terminal pins extending from the housing, and each housing extending in a direction substantially parallel to a plane comprising the PCB beyond an edge of the PCB; and a clamp bar secured to the thermally conductive structure and adapted to compressively secure each housing between the clamp bar and a surface of the thermally conductive structure and to maintain thermal contact between a surface of each housing and the surface of the thermally conductive structure.

In one aspect, the system further comprises a thermally conductive and electrically insulative pad positioned upon the surface of the thermally conductive structure between the surface of each housing and the thermally conductive structure.

In one aspect, the clamp bar comprises a plurality of spring clamp elements, each spring clamp element compressively securing a respective one of the plurality of devices to maintain thermal contact between a surface of the device housing and the thermally conductive structure.

In one aspect, the plurality of spring clamp elements are formed on a base wall of the clamp bar.

In one aspect, the clamp bar comprises a U-shaped bar, the base wall being bounded along opposite side edges by side walls.

In one aspect, each of the plurality of discrete electronic semiconductor devices comprises a switching circuit.

In one aspect, each of the plurality of discrete electronic semiconductor devices comprises an insulated-gate bipolar transistor (IGBT).

In one aspect, the thermally conductive structure is integrally formed with the casing, the PCB being mounted to the casing.

In one aspect, the clamp bar includes a plurality of spring clamp elements, each spring clamp element compressively securing a respective one of the plurality of devices to maintain thermal contact between a surface of the device housing and a thermally conductive and electrically insulative pad positioned upon the surface of the thermally conductive structure.

In one aspect, the thermally conductive structure extends from the casing wall inward into the enclosed space in a direction substantially perpendicular to the plane of the PCB and substantially perpendicular to the surface of each housing, the surface of each housing being substantially parallel with one another, such that the thermally conductive structure extends inward from the casing wall to accommodate a required distance between the casing wall and a lower surface of the PCB, the lower surface of the PCB having the discrete electronic components attached thereon.

FIGS. 1-4 and 7-9 show example configurations with relative positioning of the various components. If shown directly contacting each other, or directly coupled, then such elements may be referred to as directly contacting or directly coupled, respectively, at least in one example. Similarly, elements shown contiguous or adjacent to one another may be contiguous or adjacent to each other, respectively, at least in one example. As an example, components laying in face-sharing contact with each other may be referred to as in face-sharing contact. As another example, elements positioned apart from each other with only a space therebetween and no other components may be referred to as such, in at least one example. As yet another example, elements shown above/below one another, at opposite sides to one another, or to the left/right of one another may be referred to as such, relative to one another. Further, as shown in the figures, a topmost element or point of element may be referred to as a "top" of the component and a bottommost element or point of the element may be referred to as a "bottom" of the component, in at least one example. As used herein, top/bottom, upper/lower, above/below, may be relative to a vertical axis of the figures and used to describe positioning of elements of the figures relative to one another.

As such, elements shown above other elements are positioned vertically above the other elements, in one example. As yet another example, shapes of the elements depicted within the figures may be referred to as having those shapes (e.g., such as being circular, straight, planar, curved, rounded, chamfered, angled, or the like). Further, elements shown intersecting one another may be referred to as intersecting elements or intersecting one another, in at least one example. Further still, an element shown within another element or shown outside of another element may be referred as such, in one example.

Certain adaptations and modifications of the described embodiments can be made. Therefore, the above discussed embodiments are considered to be illustrative and not restrictive. The present disclosure is not to be limited in scope by the specific embodiments described herein. Further example embodiments may also include all of the steps, features, compositions and compounds referred to or indicated in this description, individually or collectively and any and all combinations or any two or more of the steps or features.

Throughout this document, the use of the word "a" or "an" when used in conjunction with the term "comprising" in the claims and/or the specification may mean "one", but it is also consistent with the meaning of "one or more", "at least one", and "one or more than one". Similarly, the word "another" may mean at least a second or more. The words "comprising" (and any form of comprising, such as "comprise" and comprises), "having" (and any form of having, such as "have" and "has"), "including" (and any form of including, such as "include" and "includes") or "containing" (and any form of containing, such as "contain" and "contains"), are inclusive or open-ended and do not exclude additional, unrecited elements or process steps.

In the present specification and in the appended claims, various terminology which is directional, geometrical and/or spatial in nature such as "longitudinal", "horizontal", "front", "forward", "backward", "back", "rear", "upwardly", "downwardly", etc. is used. It is to be understood that such terminology is used for ease of description and in a relative sense only and is not to be taken in any way as specifying an absolute direction or orientation.

The embodiments described herein may include one or more range of values (for example, size, displacement and field strength etc.). A range of values will be understood to include all values within the range, including the values defining the range, and values adjacent to the range that lead to the same or substantially the same outcome as the values immediately adjacent to that value which defines the boundary to the range. For example, a person skilled in the field will understand that a 10% variation in upper or lower limits of a range can be totally appropriate and is encompassed by the disclosure. More particularly, the variation in upper or lower limits of a range will be 5% or as is commonly recognized in the art, whichever is greater.

Throughout this specification relative language such as the words 'about' and 'approximately' are used. This language seeks to incorporate at least 10% variability to the specified number or range. That variability may be plus 10% or negative 10% of the particular number specified.

What is claimed is:

1. A thermal interface for a plurality of discrete electronic semiconductor devices, the interface comprising:
   a thermally conductive structure extending from a base;
   a PCB mounted in a position relative to the thermal conductive structure and populated with discrete electronic components;
   each of the plurality of discrete electronic semiconductor devices having a housing and terminal pins extending from the housing, and each housing extending in a direction substantially parallel to a plane comprising the PCB beyond an edge of the PCB; and
   a U-shaped clamp bar secured to the thermally conductive structure via a plurality of projections being integrally formed from the thermally conductive structure, and extending upward from a housing supporting surface of the thermally conductive structure and spaced apart from one another along a length of the clamp bar,
   each of the plurality of integrally formed projections having an insulative ferrule completely surrounding the projection and providing a fastening surface facing the clamp bar against which the clamp bar is securably fastened so as to securably fasten the clamp bar to the thermally conductive structure with each housing positioned between the clamp bar and the housing supporting surface of the thermally conductive structure,
   wherein the clamp bar is adapted to compressively secure each housing between the clamp bar and the housing supporting surface of the thermally conductive structure and to maintain thermal contact between a surface of each housing and the housing supporting surface of the thermally conductive structure.

2. The interface of claim 1, further comprising a thermally conductive and electrically insulative pad positioned upon the surface of the thermally conductive structure between the surface of each housing and the thermally conductive structure.

3. The interface of claim 1, wherein the clamp bar comprises a plurality of spring clamp elements, each spring clamp element compressively securing a respective one of the plurality of devices to maintain thermal contact between a surface of the device housing and the thermally conductive structure.

4. The interface of claim 3, wherein the plurality of spring clamp elements are formed on a base wall of the clamp bar.

5. The interface of claim 4, wherein the U-shaped clamp bar comprises the base wall being bounded along opposite side edges by side walls.

6. The interface of claim 1, wherein each of the plurality of discrete electronic semiconductor devices comprises a switching circuit.

7. The interface of claim 6, wherein each of the plurality of discrete electronic semiconductor devices comprises an insulated-gate bipolar transistor (IGBT).

8. The interface of claim 1, wherein the thermally conductive structure is integrally formed with the base, the PCB being mounted to the base.

9. The interface of claim 1, wherein the clamp bar includes a plurality of spring clamp elements, each spring clamp element compressively securing a respective one of the plurality of devices to maintain thermal contact between a surface of the device housing and a thermally conductive and electrically insulative pad positioned upon the surface of the thermally conductive structure.

10. The interface of claim 1, wherein the thermally conductive structure extends from the base in a direction substantially perpendicular to the plane of the PCB and substantially perpendicular to the surface of each housing, the surface of each housing being substantially parallel with one another, such that the thermally conductive structure extends from the base to accommodate a required distance between the base and a lower surface of the PCB, the lower surface of the PCB having the discrete electronic components attached thereon.

11. A motor vehicle power electronics system having a thermal interface for a plurality of discrete electronic semiconductor devices, the system comprising:
    a casing adapted to enclose the plurality of devices in an enclosed space, the casing having a thermally conductive structure extending inward into the enclosed space from a wall of the casing;
    a PCB mounted within the enclosed space and populated with discrete electronic components;
    each of the plurality of discrete electronic semiconductor devices having a housing and terminal pins extending from the housing, and each housing extending in a direction substantially parallel to a plane comprising the PCB beyond an edge of the PCB; and
    a U-shaped clamp bar secured to the thermally conductive structure via a plurality of projections being integrally formed from the thermally conductive structure, and extending upward from a housing supporting surface of the thermally conductive structure and spaced apart from one another along a length of the clamp bar, each of the plurality of integrally formed projections having an insulative ferrule completely surrounding the projection and providing a fastening surface facing the clamp bar against which the clamp bar is securably fastened so as to securably fasten the clamp bar to the thermally conductive structure with each housing positioned between the clamp bar and the housing supporting surface of the thermally conductive structure, wherein the clamp bar is adapted to compressively secure each housing between the clamp bar and the housing supporting surface of the thermally conductive structure and to maintain thermal contact between a surface of each housing and the housing supporting surface of the thermally conductive structure.

12. The system of claim 11, further comprising a thermally conductive and electrically insulative pad positioned upon the surface of the thermally conductive structure between the surface of each housing and the thermally conductive structure.

13. The system of claim 11, wherein the clamp bar comprises a plurality of spring clamp elements, each spring clamp element compressively securing a respective one of the plurality of devices to maintain thermal contact between a surface of the device housing and the thermally conductive structure.

14. The system of claim 13, wherein the plurality of spring clamp elements are formed on a base wall of the clamp bar.

15. The system of claim 14, wherein the U-shaped clamp bar comprises the base wall being bounded along opposite side edges by side walls.

16. The system of claim 11, wherein each of the plurality of discrete electronic semiconductor devices comprises a switching circuit.

17. The system of claim 16, wherein each of the plurality of discrete electronic semiconductor devices comprises an insulated-gate bipolar transistor (IGBT).

18. The system of claim 11, wherein the thermally conductive structure is integrally formed with the casing, the PCB being mounted to the casing.

19. The system of claim 11, wherein the clamp bar includes a plurality of spring clamp elements, each spring clamp element compressively securing a respective one of the plurality of devices to maintain thermal contact between a surface of the device housing and a thermally conductive and electrically insulative pad positioned upon the surface of the thermally conductive structure.

20. The system of claim 11, wherein the thermally conductive structure extends from the casing wall inward into the enclosed space in a direction substantially perpendicular to the plane of the PCB and substantially perpendicular to the surface of each housing, the surface of each housing being substantially parallel with one another, such that the thermally conductive structure extends inward from the casing wall to accommodate a required distance between the casing wall and a lower surface of the PCB, the lower surface of the PCB having the discrete electronic components attached thereon.

* * * * *